(12) United States Patent
Komiya et al.

(10) Patent No.: US 10,573,539 B2
(45) Date of Patent: Feb. 25, 2020

(54) SUBSTRATE LIQUID PROCESSING APPARATUS

(71) Applicant: Tokyo Electron Limited, Tokyo (JP)

(72) Inventors: Hiroshi Komiya, Koshi (JP); Yasuhiro Takaki, Koshi (JP); Shinichi Umeno, Koshi (JP); Koji Tanaka, Koshi (JP); Takami Satoh, Koshi (JP); Atsushi Anamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 137 days.

(21) Appl. No.: 15/535,882

(22) PCT Filed: Dec. 15, 2015

(86) PCT No.: PCT/JP2015/085092
§ 371 (c)(1),
(2) Date: Jun. 14, 2017

(87) PCT Pub. No.: WO2016/098776
PCT Pub. Date: Jun. 23, 2016

(65) Prior Publication Data
US 2018/0358240 A1    Dec. 13, 2018

(30) Foreign Application Priority Data

Dec. 16, 2014  (JP) .................... 2014-253576
Oct. 23, 2015  (JP) .................... 2015-208586

(51) Int. Cl.
*H01L 21/67* (2006.01)
*B08B 3/04* (2006.01)

(52) U.S. Cl.
CPC ......... *H01L 21/67023* (2013.01); *B08B 3/04* (2013.01); *H01L 21/67173* (2013.01); *B08B 2203/027* (2013.01)

(58) Field of Classification Search
None
See application file for complete search history.

(56) References Cited

U.S. PATENT DOCUMENTS 5,666,985 A * 9/1997 Smith, Jr. ............... B08B 3/02
                                                   134/102.2

FOREIGN PATENT DOCUMENTS

| JP | 2007-273510 A | 10/2007 |
| JP | 2008-034490 A | 2/2008 |

OTHER PUBLICATIONS

Matsumoto, Liquid Processing Device, 2008, JP2008-034490A (Year: 2008).*

(Continued)

*Primary Examiner* — Cristi J Tate-Sims
(74) *Attorney, Agent, or Firm* — Pearne & Gordon LLP

(57) ABSTRACT

A substrate liquid processing apparatus includes a transfer section, a processing section, a reservoir and a liquid sending mechanism. The transfer section includes a transfer device configured to transfer a substrate. The processing section is provided adjacent to the transfer section in a horizontal direction, and includes a liquid processing unit configured to process the substrate by using a processing liquid. The reservoir is configured to store the processing liquid therein. The liquid sending mechanism is configured to send out the processing liquid stored in the reservoir into the liquid processing unit. The reservoir is disposed directly under the transfer section. Further, the liquid sending mechanism is disposed directly under the processing section. Space saving of the substrate liquid processing apparatus can be achieved.

10 Claims, 12 Drawing Sheets

(56) References Cited

OTHER PUBLICATIONS

International Search Report for PCT/JP2015/085092 dated Mar. 15, 2016.

* cited by examiner

SUBSTRATE LIQUID PROCESSING APPARATUS

CROSS-REFERENCE TO RELATED APPLICATION

This Application is a U.S. national phase application under 35 U.S.C. § 371 of PCT Application No. PCT/JP2015/085092 filed on Dec. 15, 2015, which claims the benefit of Japanese Patent Application Nos. 2014-253576 and 2015-208586 filed on Dec. 16, 2014 and Oct. 23, 2015, respectively, the entire disclosures of which are incorporated herein by reference.

TECHNICAL FIELD

The various embodiments described herein pertain generally to a substrate liquid processing apparatus.

BACKGROUND ART

Conventionally, there is known a substrate liquid processing apparatus configured to perform a preset substrate processing such as a cleaning processing on a substrate such as a semiconductor wafer or a glass substrate. The substrate liquid processing apparatus includes a processing block in which a liquid processing unit configured to process the substrate by using a processing liquid is provided, and a reservoir configured to store the processing liquid and a liquid sending mechanism configured to sends out the processing liquid within the reservoir into the liquid processing unit are provided under the processing block (see, for example, Patent Document 1).

In the aforementioned substrate liquid processing apparatus, however, since the reservoir and the liquid sending mechanism are located in the same place under the processing block, a relatively large space needs to be secured under the processing block. In this regard, there is still a room for improvement in the above-stated substrate liquid processing apparatus in the aspect of space-saving.

Patent Document 1: Japanese Patent Laid-open Publication No. 2008-034490

DISCLOSURE OF THE INVENTION

Problems to be Solved by the Invention

In view of the foregoing problems, exemplary embodiments provide a substrate liquid processing apparatus capable of achieving space-saving.

Means for Solving the Problems

In an exemplary embodiment, a substrate liquid processing apparatus includes a transfer section, a processing section, a reservoir and a liquid sending mechanism. The transfer section includes a transfer device configured to transfer a substrate. The processing section is provided adjacent to the transfer section in a horizontal direction, and includes a liquid processing unit configured to process the substrate by using a processing liquid. The reservoir is configured to store the processing liquid therein. The liquid sending mechanism is configured to send out the processing liquid stored in the reservoir into the liquid processing unit. The reservoir is disposed directly under the transfer section. Further, the liquid sending mechanism is disposed directly under the processing section.

DETAILED DESCRIPTION

In the following, a substrate liquid processing apparatus according to exemplary embodiments will be described in detail, and reference is made to the accompanying drawings, which form a part of the description. Here, it should be noted that the exemplary embodiments are not limiting.

First Exemplary Embodiment

Figure 1:
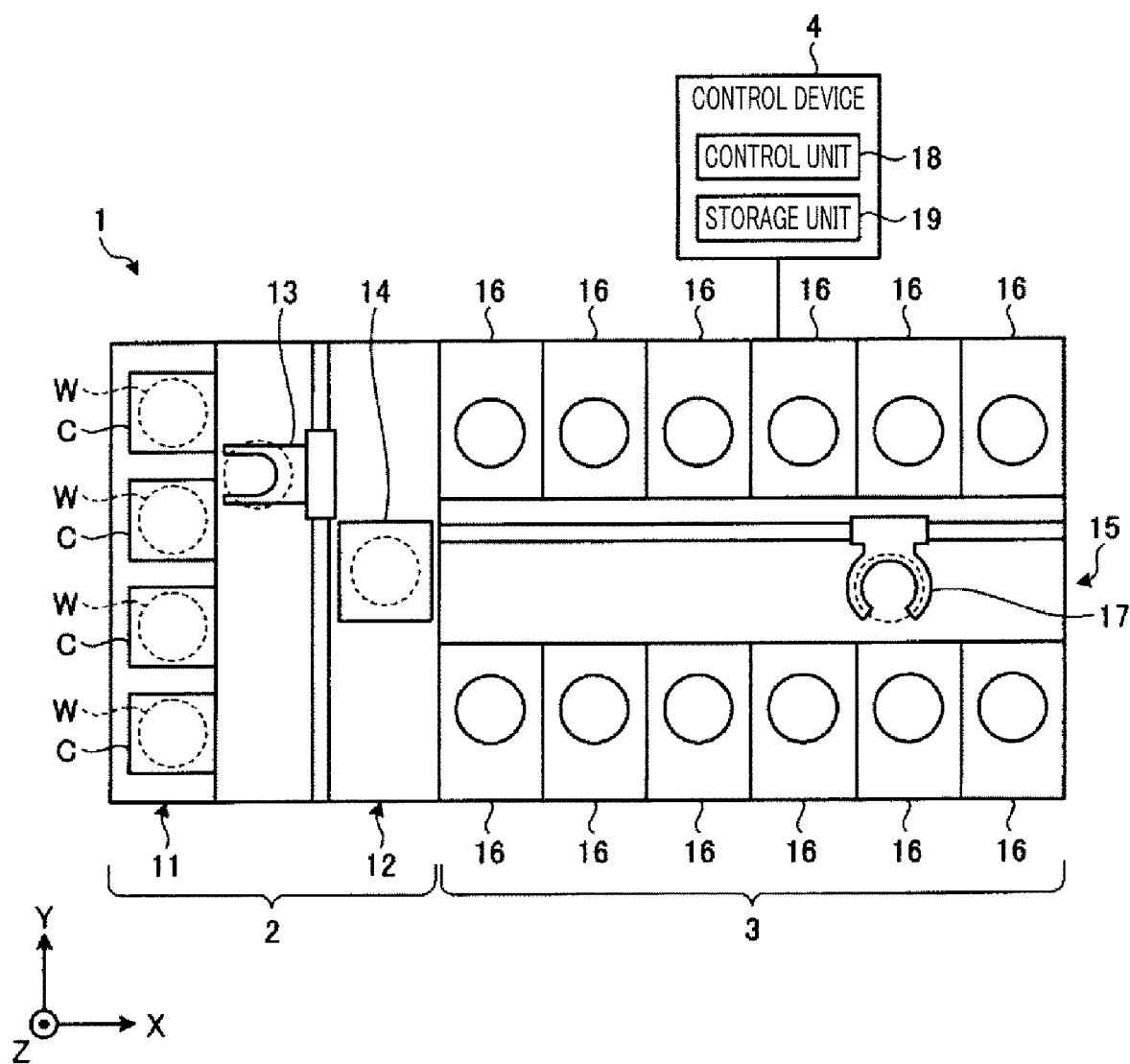
FIG. 1 is a diagram illustrating an outline of a substrate liquid processing system according to a first exemplary embodiment.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a control unit 18 and a storage unit 19. The storage unit 19 stores a program that controls various processings performed in the substrate processing system 1. The control unit 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
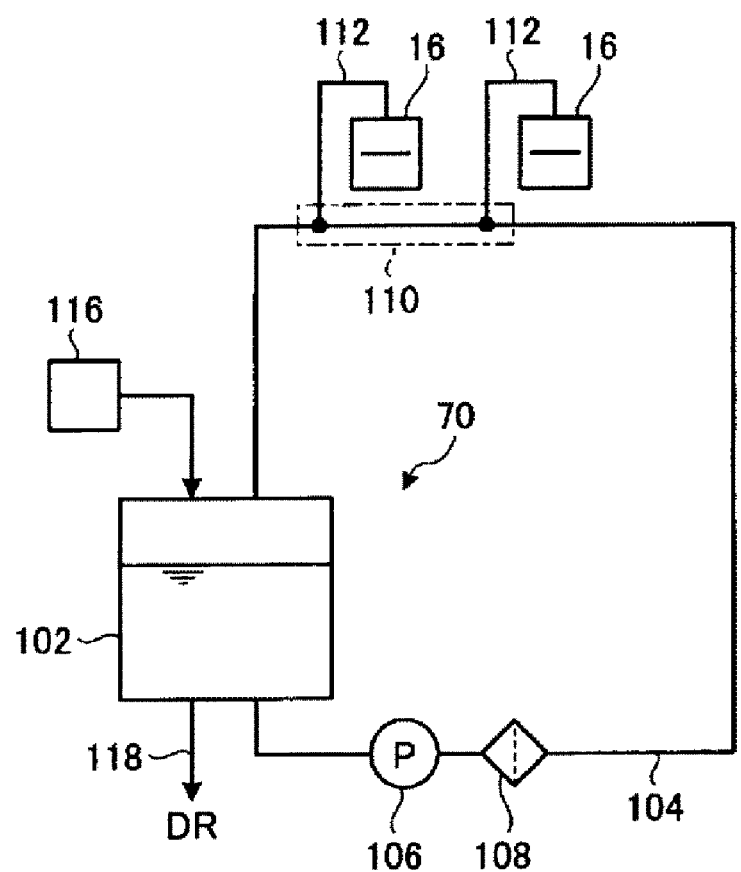
FIG. 2 is a diagram illustrating an outline of a processing liquid supply system of the substrate processing system.

Now, a processing liquid supply system including a liquid processing apparatus configured to supply a processing liquid into the processing unit 16 will be explained with reference to FIG. 2. FIG. 2 is a diagram illustrating a schematic configuration of the processing liquid supply system of the substrate processing system 1.

As depicted in FIG. 2, the liquid processing apparatus includes the plurality of processing units (liquid processing units) 16 each configured to perform a liquid processing on the substrate; and a processing fluid supply source 70 configured to supply the processing liquid into the processing units 16.

The processing fluid supply source 70 includes a tank 102 configured to store the processing liquid therein; and a circulation line 104 which starts from the tank 102 and returns back into the tank 102. The circulation line 104 is equipped with a pump 106. The pump 106 is configured to form a circulation flow which starts from the tank 102 and returns back into the tank 102 via the circulation line 104. At a downstream side of the pump 106, the circulation line 104 is equipped with a filter 108 configured to remove a contaminant such as a particle contained in the processing liquid. Further, an auxiliary device (e.g., a heater or the like) may be additionally provided on the circulation line 104, if necessary.

A single or a plurality of branch lines 112 is connected to a connection region 110 set on the circulation line 104. Each branch line 112 is configured to supply the processing liquid flowing in the circulation line 104 into the corresponding processing unit 16. Each branch line 112 may be provided with a flow rate controller such as a flow rate control valve, a filter and so forth, as required.

The liquid processing apparatus includes a tank liquid supplementing unit 116 configured to supplement the tank 102 with the processing liquid or a component constituting the processing liquid. The tank 102 is also provided with a drain unit 118 configured to drain out the processing liquid within the tank 102.

Figure 3:
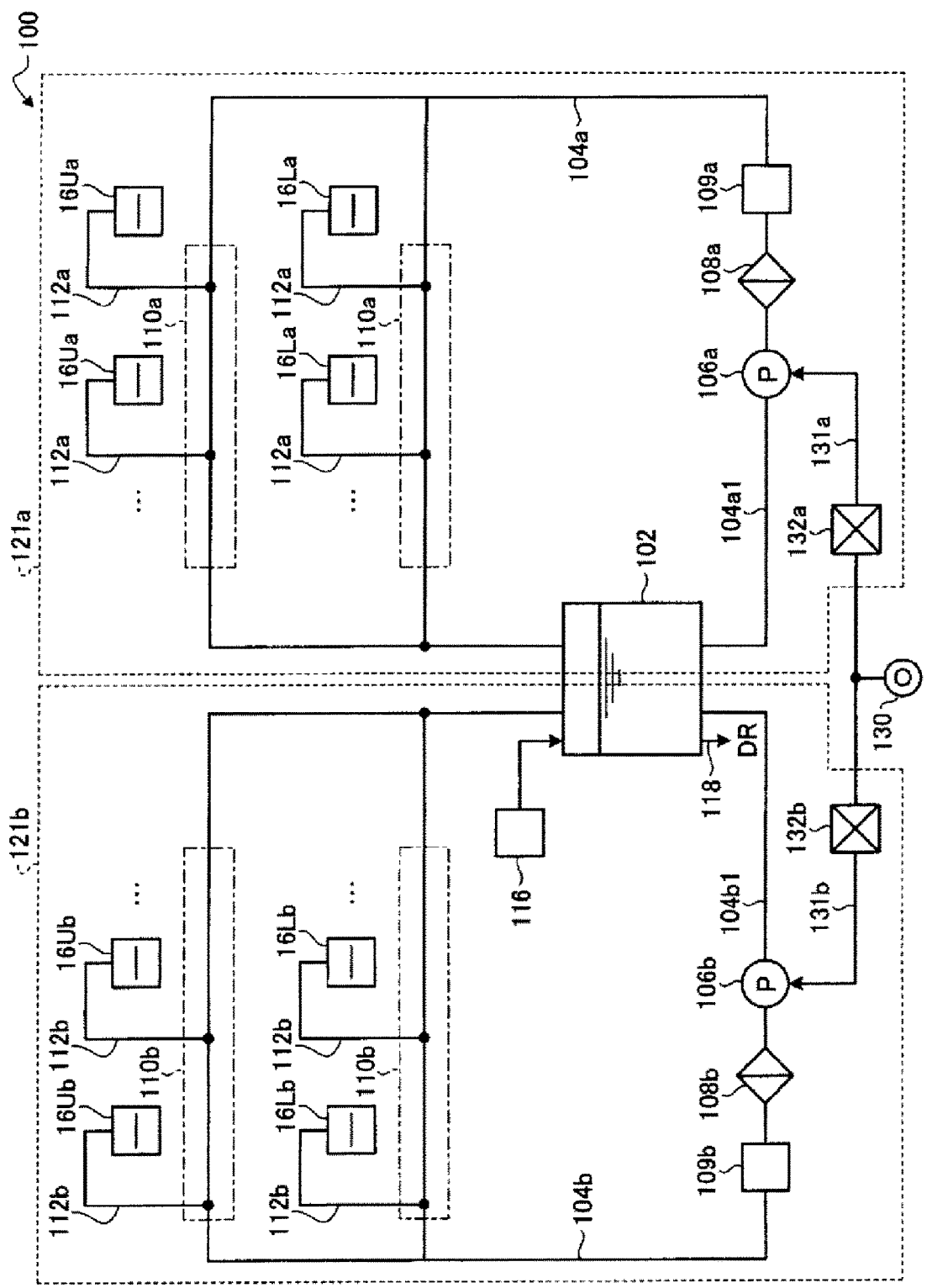
FIG. 3 is a diagram illustrating a configuration example of a substrate liquid processing apparatus.

Now, a configuration of the aforementioned liquid processing apparatus (hereinafter, referred to as "substrate liquid processing apparatus 100") will be elaborated in further detail with reference to FIG. 3. FIG. 3 is a diagram illustrating a configuration example of the substrate liquid processing apparatus 100 according to the first exemplary embodiment.

As shown in FIG. 3, the substrate liquid processing apparatus 100 includes a first processing liquid supply system 121a and a second processing liquid supply system 121b. Further, among individual constituent components shown in FIG. 3, those belonging to the first processing liquid supply system 121a will be assigned "a" at the end of each reference numeral, and those belonging to the second processing liquid supply system 121b will be assigned "b" at the end of each reference numeral. Furthermore, though the substrate liquid processing apparatus 100 has been described to be equipped with the two processing liquid supply systems as mentioned above, the number of the processing liquid supply systems may not be limited thereto, but may be one or more than two.

In the following, the first processing liquid supply system 121a will be discussed. Further, a flow of the processing liquid or the like in the first processing liquid supply system 121a is substantially the same as that in the second processing liquid supply system 121b. Thus, the following description is mostly valid to the second processing liquid supply system 121b as well. Furthermore, the substrate liquid processing apparatus 100 includes another set of a first and a second processing liquid supply systems 121a and 121b having another tank 102, and the following description is mostly valid to this another set.

In the substrate liquid processing apparatus 100, the tank (an example of "reservoir") 102 is connected with the aforementioned circulation line 104a. The circulation line 104a is provided with a pump (an example of "liquid sending mechanism") 106a, a filter 108a and a heater 109a in sequence from the upstream side thereof.

The pump 106a is configured to send out the processing liquid stored in the tank 102 into multiple processing units 16Ua and 16La (examples of "liquid processing unit"). Further, the processing liquid may be, by way of non-limiting example, SC1 (a mixed solution of ammonia, hydrogen peroxide and water), HF (hydrofluoric acid), or IPA (isopropyl alcohol).

The pump 106a may be implemented by, but not limited to, air-driven bellows pump. In case that the pump 106a is the bellows pump, an air supply source 130 is connected to the pump 106a via an air line 131a. The air line 131a is provided with a control valve 132a which is configured to control an air supply rate into the pump 106a. Accordingly, the pump 106a is operated as air is supplied from the air supply source 130 into the pump 106a through the air line 131a by opening/closing the control valve 132a.

Furthermore, in the above description, the pump 106a is described to be the bellows pump, but not limited thereto. By way of example, a diaphragm pump, a plunger pump, or any other kind of pump may be used.

The filter 108a is configured to remove a contaminant within the processing liquid, as stated above. Further, the heater 109a is configured to heat the processing liquid passing therethrough up to a preset temperature. Depending on the kind of the processing liquid, the heater 109a may be omitted.

Figure 4:
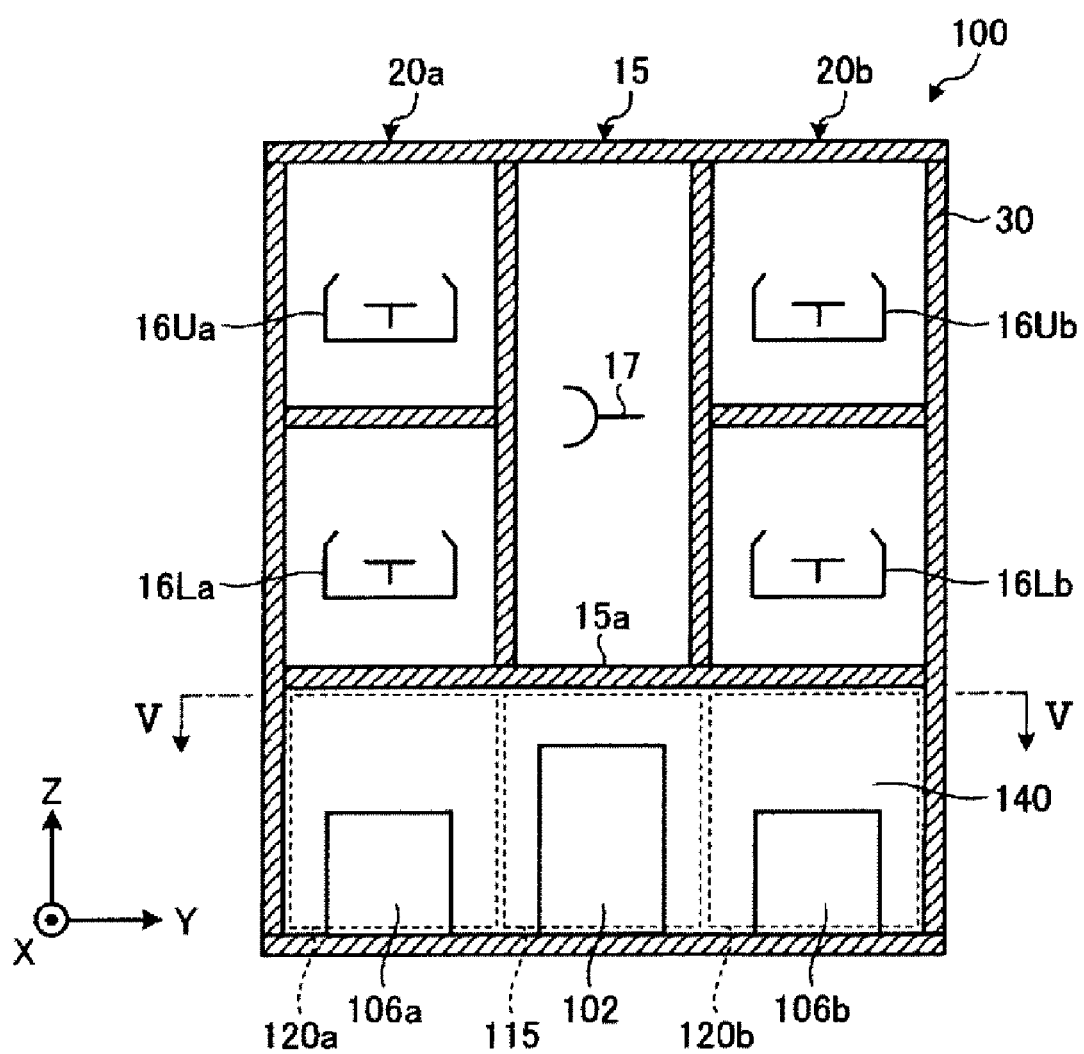
FIG. 4 is a longitudinal cross sectional view of a processing station taken along a Y-Z plane.

FIG. 4 is a longitudinal cross sectional view taken along a Y-Z plane of the processing station 3. As depicted in FIG. 4, the aforementioned multiple processing units 16Ua and 16La are vertically stacked in two levels. Here, the processing unit 16 located at the upper level will sometimes be referred to as "processing unit 16Ua" and the processing unit 16 located at the lower level will sometimes be referred to as "processing unit 16La."

Further, in the present exemplary embodiment, though the processing units 16 are vertically stacked in the two levels, the stacking number of the processing units 16 may not be limited to two. Furthermore, the number of the processing units 16 may not be limited to the shown example, either. For the simplicity of illustration, only four processing units 16Ua and 16La are shown in FIG. 3 while the others are omitted.

Now, arrangement positions of the plurality of processing units 16Ua, 16La, 16Ub and 16Lb, the tank 102, the pumps 106a and 106b and so forth in the substrate liquid processing apparatus 100 having the above-described configuration will be explained.

The plurality of processing units 16Ua, 16La, 16Ub and 16Lb are arranged along the transfer section 15, as shown in FIG. 1. To elaborate, the transfer section 15 is provided such that a transfer chamber 15a (see FIG. 4) accommodating therein the substrate transfer device 17 is extended along the X-axis.

In FIG. 1, multiple processing units 16 provided at a negative Y-axis side (lower side of the paper) with respect to the transfer section 15 and arranged along the X-axis correspond to the processing units 16Ua in the first processing liquid supply system 121a. Further, in FIG. 1, the processing units 16La of the lower level are hidden by the processing units 16Ua of the upper level.

Meanwhile, multiple processing units 16 provided at a positive Y-axis side (upper side of the paper) with respect to the transfer section 15 and arranged along the X-axis correspond to the processing units 16Ub in the second processing liquid supply system 121b. Further, in FIG. 1, the processing units 16Lb of the lower level are hidden by the processing units 16Ub of the upper level.

In the following, in the substrate liquid processing apparatus 100, a region where the processing units 16Ua and 16La of the first processing liquid supply system 121a are arranged will sometimes be referred to as "first processing section 20a" (see FIG. 4). Further, in the substrate liquid processing apparatus 100, a region where the processing units 16Ub and 16Lb of the second processing liquid supply system 121b will sometimes be referred to as "second processing section 20b" (see FIG. 4).

As depicted in FIG. 4, the first processing 20a and the second processing section 20b are arranged adjacent to the transfer section 15 in the horizontal direction. Further, the first processing section 20a and the second processing section 20b are arranged in parallel at positions facing each other with the transfer section 15 therebetween. The wafers W are transferred into the first processing section 20a and the second processing section 20b by the substrate transfer device 17 of the transfer section 15.

The substrate liquid processing apparatus 100 includes an accommodation unit 30 in which the first and second processing sections 20a and 20b, the transfer section 15, the tank 102, the pumps 106a and 106b, and so forth are accommodated. The accommodation unit 30 may be, by way of non-limiting example, a housing or casing the inside of which is partitioned into multiple rooms.

In the conventional substrate liquid processing apparatus, tank and pumps, for example, are all located in the same place under the processing section. For this reason, a relatively large space is required under the processing section, so that there is a concern that the substrate liquid processing apparatus may be too scaled up. Thus, in the conventional substrate liquid processing apparatus, there is still a room for improvement in that space needs to be saved.

In this regard, the substrate liquid processing apparatus 100 according to the present exemplary embodiment has an inventive configuration in which the space saving can be achieved and the arrangement area can be reduced. Below, this configuration will be elaborated.

As illustrated in FIG. 4, the first and second processing sections 20a and 20b and the transfer section 15 are arranged at an upper portion of the accommodation unit 30 in the Z-axis direction. Within the accommodation unit 30, a space 140 is formed under the first and second processing sections 20a and 20b and the transfer section 15.

Figure 5:
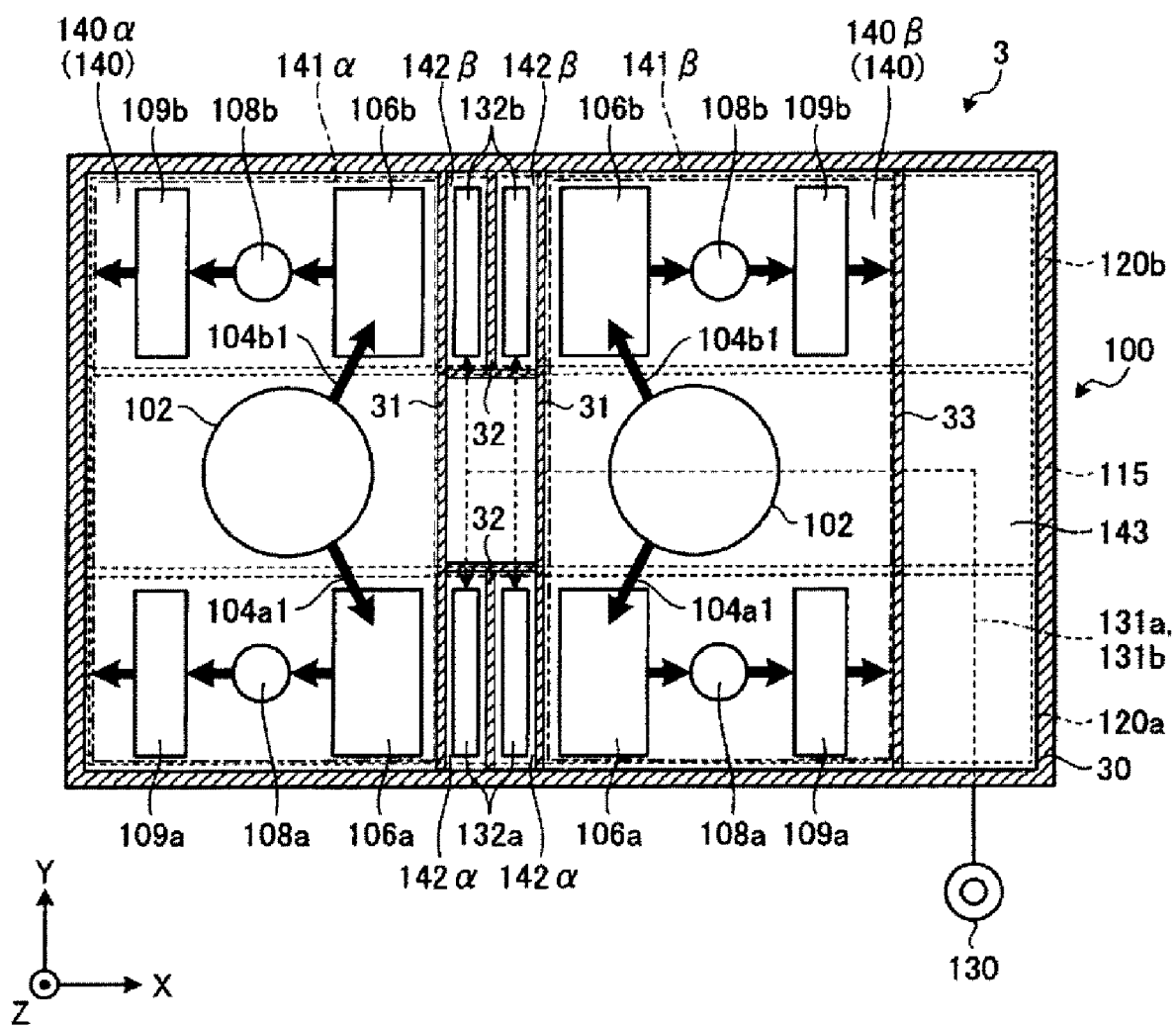
FIG. 5 is a cross sectional view taken along a line V-V of FIG. 4.

FIG. 5 is a cross sectional view taken along a line V-V of FIG. 4. Further, in FIG. 4 and FIG. 5, a portion of the space 140 located under the first processing section 20a is indicated by a dashed line assigned a reference numeral 120a. Likewise, in FIG. 4 and FIG. 5, a portion of the space 140 located under the second processing section 20b is indicated by a dashed line assigned a reference numeral 120b; and a portion of the space 140 located under the transfer section 15, by a dashed line assigned a reference numeral 115.

As depicted in FIG. 4 and FIG. 5, the tank 102 is located directly under the transfer section 15, that is, in the space 115. Further, in the example shown in FIG. 4 and FIG. 5, though the tank 102 is entirely accommodated within the space 115 of the accommodation unit 30, the exemplary embodiment is not limited thereto, and a part of the tank 102, for example, may be protruded from the space 115.

Further, the pumps 106a and 106b are disposed directly under the first and second processing sections 20a and 20b. To be specific, the pump 106a is placed directly under the first processing section 20a, that is, in the space 120a. Meanwhile, the pump 106b is placed directly under the second processing section 20b, that is, in the space 120b.

In the description that follows, the pump 106a provided directly under the first processing section 20a will sometimes be referred to as "first pump 106a" (an example of "first liquid sending mechanism"), and the pump 106b provided directly under the second processing section 20b will sometimes be referred to as "second pump 106b" (an example of "second liquid sending mechanism").

As stated above, in the substrate liquid processing apparatus 100, the tank 102 is placed directly under the transfer section 15; the first pump 106a, directly under the first processing section 20a; and the second pump 106b, directly under the second processing section 20b. Therefore, the space 140 within the accommodation unit 30 can be effectively utilized.

Accordingly, as compared to the configuration in which the tank 102 and the first and second pumps 106a and 106b are placed in the same place under the first processing section 20a, for example, the space 120a under the first processing section 20a can be scaled down, so that space-saving can be achieved in the substrate liquid processing apparatus 100. Furthermore, along with the space-saving of the substrate liquid processing apparatus 100, the arrangement space thereof can also be reduced.

The first pump 106a configured to supply the processing liquid into the processing units 16Ua and 16La is placed directly under the first processing section 20a having the processing units 16Ua and 16La. Likewise, the second pump 106b configured to supply the processing liquid into the processing units 16Ub and 16Lb is disposed directly under the second processing section 20b having the processing units 16Ub and 16Lb.

Accordingly, a length of the circulation line 104a (see FIG. 3) from the first pump 106a to the processing units 16Ua and 16La and a length of a circulation line 104b (see FIG. 3) from the second pump 106b to the processing units 16Ub and 16Lb can be shortened. Further, as the circulation lines 104a and 104b are shortened, the processing liquid can be efficiently supplied into the individual processing units 16Ua, 16La, 16Ub and 16Lb, and the arrangement space for the substrate liquid processing apparatus 100 can be further saved.

Furthermore, as depicted in FIG. 5, the substrate liquid processing apparatus 100 includes the two tanks 102, and the first pump 106a and the second pump 106b are respectively connected to the each corresponding tank 102.

In the example of the substrate liquid processing apparatus 100 shown in FIG. 5, a device group (that is, a device combination) including the tank 102 and the first and second pumps 106a and 106b connected to the corresponding tank 102 are provided in plural sets (here, two sets). Further, in FIG. 5, one of the two device groups is assigned a reference numeral 141α, and the other device group is assigned a reference numeral 141β. Each of these device groups 141α and 141β may include the filters 108a and 108b, the heaters 109a and 109b, and so forth corresponding to the tank 102.

Further, in the accommodation unit 30, partition walls 31 are provided between the device groups 141α and 141β. These partition walls 31 are extended from a bottom surface of the accommodation unit 30 up to bottom surfaces of the first and second processing sections 20a and 20b and the transfer section 15. Accordingly, the space 140 of the accommodation unit 30 is divided into a space 140α and a space 140β by the partition walls 31.

As stated, in the substrate liquid processing apparatus 100, the device group 141α and the device group 141β are accommodated in the accommodation unit 30 while being separated from each other. Accordingly, though not shown, in the substrate liquid processing apparatus 100, for example, it is possible to perform management of air conditioning such as gas exhaust or temperature control for each of the space 140α in which the device group 141α is placed and the space 140β in which the device group 141β is placed. As a consequence, quality of substrate processing can be improved. Further, the processing liquids stored in the aforementioned two tanks 102 may be of the same kind or different kinds. The number of the tanks 102 is not limited to two.

The first pump 106a and the second pump 106b are connected to the tank 102. That is, in the substrate liquid processing apparatus 100, the single tank 102 can be shared by the first pump 106a and the second pump 106b.

Furthermore, as stated above, since the first processing section 20a and the second processing section 20b are disposed at the facing positions with the transfer section 15 therebetween, the tank 102 is provided between the first pump 106a and the second pump 106b.

Accordingly, a length of a first liquid line 104a1 (see FIG. 3) of the circulation line 104a from the tank 102 to the first pump 106a and a length of a second liquid line 104b1 (see FIG. 3) of the circulation line 104b from the tank 102 to the second pump 106b can be shortened. Furthermore, as the liquid lines 104a1 and 104b1 are shortened, the processing liquid can be efficiently supplied to the first pump 106a and the second pump 106b, so that further space-saving of the substrate liquid processing apparatus 100 can be achieved.

Here, it is desirable that the length of the first liquid line 104a1 and the length of the second liquid line 104b1 are same. If they are same, it is possible to perform uniform processing in the processing units 16Ua, 16La, 16Ub and 16Lb of the substrate liquid processing apparatus 100.

That is, for example, if the lengths of the first liquid line 104a1 and the second liquid line 104b1 are greatly different, pressure losses in the respective liquid lines 104a1 and 104b1 may be different. As a result, the processing liquid supplied to the processing units 16Ua and 16La and the processing liquid supplied to the processing units 16Ub and 16Lb may be differed in the flow rate or the like, so that it becomes difficult to perform the uniform processing in the processing units 16Ua, 16La, 16Ub and 16Lb.

In the substrate liquid processing apparatus 100 according to the present exemplary embodiment, since the lengths of the first liquid line 104a1 and the second liquid line 104b1 are set to be same, the pressure losses in the first liquid line 104a1 and the second liquid line 104b1 may also be substantially same. Accordingly, the processing units 16Ua and 16La and the processing units 16Ub and 16Lb are enabled to perform the uniform processing.

Here, the condition that the lengths of the first liquid line 104a1 and the second liquid line 104b1 are "same" does not only means that their lengths are completely equal. For example, if a difference between design lengths of the first liquid line 104a1 and the second liquid line 104b1 is so small that no difference in the pressure loss is caused between the two lines or if a difference between actual lengths of the first liquid line 104a1 and the second liquid line 104b1 is as small as can be considered to be within an error range in the manufacture or installation of the liquid lines, the lengths of both liquid lines may be regarded to be "same." Furthermore, by adjusting diameters or material types of the first and second liquid lines 104a1 and 104b1 as well as the lengths thereof, the pressure losses of the first liquid line 104a1 and the second liquid line 104b1 may be set to be substantially same.

As depicted in FIG. 5, in the accommodation unit 30, partition walls 32 for forming four spaces 142α, 142α, 142β and 142β are provided between the aforementioned partition walls 31. Among these spaces 142α, 142α, 142β and 142β, control valves 132a for the first pumps 106a are placed in the spaces 142α adjacent to the corresponding first pumps 106a, respectively, and control valves 132b for the second pumps 106b are arranged in the spaces 142β adjacent to the second pumps 106b, respectively.

Moreover, the control valves 132a for the first pumps 106a are disposed directly under the first processing section 20a, and the control valves 132b for the second pumps 106b are disposed directly under the second processing section 20b.

With this configuration, a length of the air line 131a from the control valve 132a to the first pump 106a and a length of an air line 131b from the control valve 132b to the second pump 106b can be shortened. Furthermore, as the air lines 131a and 131b are shortened, air can be supplied to the first pump 106a and the second pump 106b efficiently, and further space-saving of the substrate liquid processing apparatus 100 can be achieved.

A partition wall 33 for forming a space 143 is provided in the vicinity of an end portion of the accommodation unit 30 in the positive X-axis direction. Various kinds of pipelines such as the air lines 131a and 131b from the air supply source 130, a gas line from a non-illustrated $N_2$ gas supply source, and so forth are accommodated in this space 143.

The air line 131a and the air line 131b are connected to the first pumps 106a and the second pumps 106b via the control valves 132a and 132b, respectively, after passing through a pipeline space (not shown) under the tank 102, for example.

Here, it is desirable that the length of the air line 131a is set to be equal to the length of the air line 131b. More desirably, a length from the control valve 132a to the first pump 16a may be equal to a length from the control valve 132b to the second pump 106b. With this configuration, it is possible to perform the uniform processing in the processing units 16Ua, 16La, 16Ub and 16Lb in the substrate liquid processing apparatus 100.

That is, for example, if the lengths of the air lines 131a and 131b are greatly different, pressure losses in the respective air lines 131a and 131b may be different. As a result, in case that the first pump 106a and the second pump 106b are the bellows pumps, there may be generated a difference in the discharge flow rate or the like between the first pump 106a and the second pump 106b, so that it is difficult to perform the uniform processing in the processing units 16Ua, 16La, 16Ub and 16Lb. Additionally, although the first pump 106a and the second pump 106b may be implemented by diaphragm pumps, plunger pumps, or the like, as mentioned above, it may be difficult, even in such cases, to perform the uniform processing in the individual processing units if the lengths of the air lines 131a and 131b are largely different.

In the substrate liquid processing apparatus 100 according to the present exemplary embodiment, since the lengths of the air lines 131a and 131b are set to be same, the pressure losses of the air lines 131a and 131b may be set to be substantially same. Accordingly, the processing units 16Ua and 16La and the processing units 16Ub and 16Lb are enabled to perform the uniform processing.

Furthermore, as in the case of the first liquid line 104a1 and the second liquid line 104b1, the condition that the lengths of the air lines 131a and 131b are "same" does not necessarily imply that their lengths are completely same. That is, if a difference between the lengths of the air lines 131a and 131b is within a tolerance range, their lengths may be considered to be "same." Moreover, the pressure losses of the air lines 131a and 131b may be set to be substantially same by adjusting diameters or material types of the air lines 131a and 131b as well as the lengths thereof.

Figure 6:
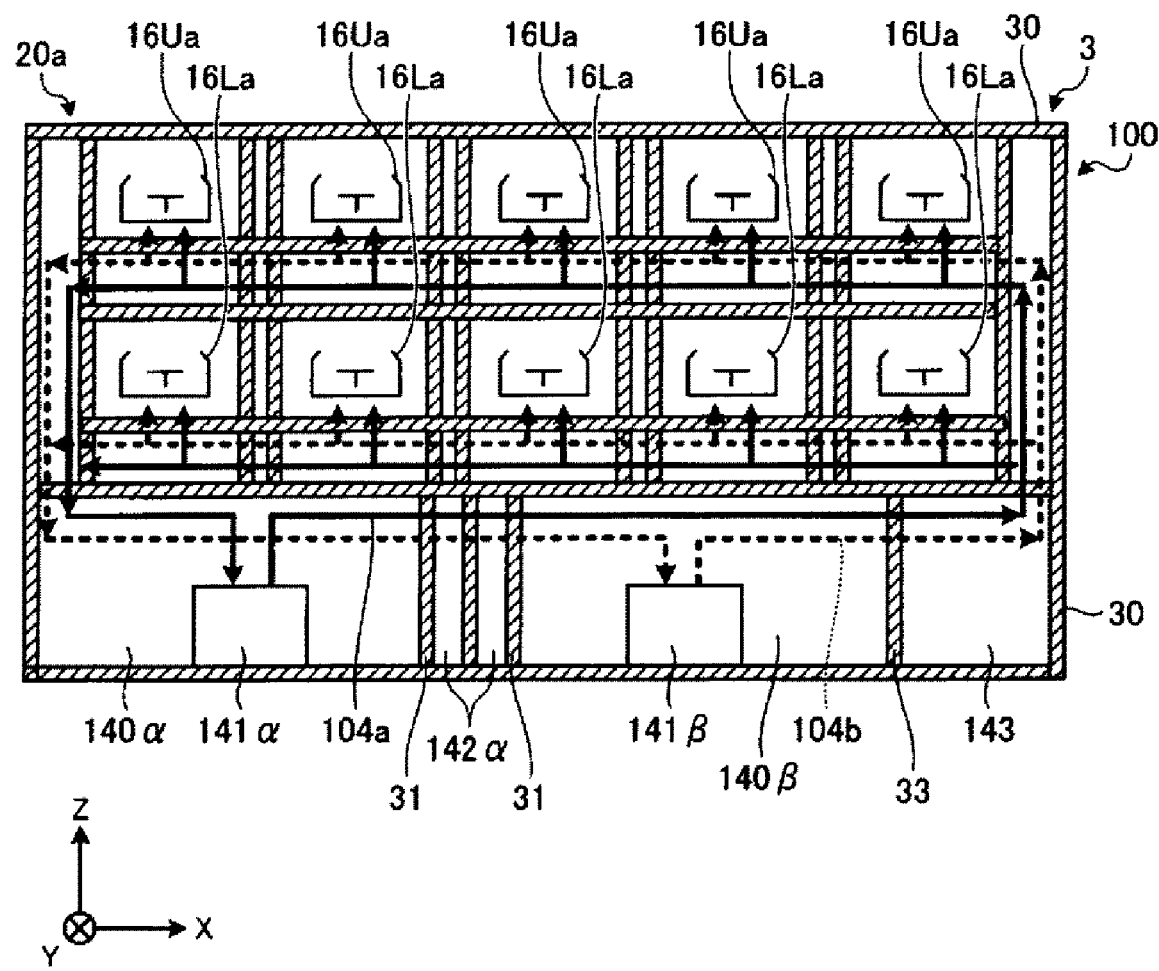
FIG. 6 is a longitudinal cross sectional view of the processing station taken along an X-Z plane.

FIG. 6 is a longitudinal cross sectional view of the processing station 3 taken along an X-Z plane. Further, in FIG. 6, to briefly illustrated, the device groups 141α and 141β, each of which includes the tank 102, the first and second pumps 106a and 106b and so forth, are illustrated by individual blocks as a whole.

As depicted in FIG. 6, the circulation line 104a extended from the device group 141α passes through the space 140β in which the adjacent device group 141β is placed after passing through the space 140α in which the device group 141α is placed, and then, is returned back into the device group 141α via the processing units 16Ua, 16La, 16Ub and 16Lb. Further, in FIG. 6, the processing units 16Ub and 16Lb are not seen by being blocked by the processing units 16Ua and 16La.

Meanwhile, the circulation line 104b extended from the device group 141β is led to the processing units 16Ua, 16La, 16Ub and 16Lb after passing through the space 140β in which the device group 141β is placed, and then, is returned back into the device group 141β through the space 140α in which the adjacent device group 141α is placed.

As stated above, in the substrate liquid processing apparatus 100 according to the present exemplary embodiment, each of the circulation lines 104a and 104b are configured to pass through the spaces 140α and 140β of the adjacent device groups 141α and 141β. Accordingly, the spaces 140α and 140β within the accommodation unit 30 can be effectively utilized, so that the space-saving within the substrate liquid processing apparatus 100 will be further achieved.

Furthermore, it may be desirable that an appropriate measure is taken to suppress the circulation line 104a passing through the space 140β from being affected by the processing liquid of the device group 141β or the like. For example, within the space 140β, the circulation line 104a may be allowed to pass through the inside a protection pipe or may have no joint portion. Further, the same measure may be taken for the circulation line 104b when it passes through the space 140α.

As stated above, the substrate liquid processing apparatus 100 according to the first exemplary embodiment includes the transfer section 15, the first and second processing sections (examples of "processing section") 20a and 20b, the tank 102, the first and second pumps 106a and 106b. The transfer section 15 is equipped with the substrate transfer device 17 configured to transfer wafers W. The first and second processing sections 20a and 20b are placed adjacent to the transfer section 15 in the horizontal direction, and the liquid processing units 16 configured to process the wafers W by using the processing liquid are disposed within the first and second processing sections 20a and 20b. The tank 102 stores therein the processing liquid from the tank liquid supplementing unit 116. The first and second pumps 106a and 106b send the processing liquid stored in the tank 102 into the liquid processing units 16. The tank 102 is provided directly under the transfer section 15. The first pump 106a and the second pump 106b are disposed directly under the first processing section 20a and the second processing section 20b, respectively. With this configuration, the space-saving within the substrate liquid processing apparatus 100 can be achieved.

Modification Example of First Exemplary Embodiment

Figure 7:
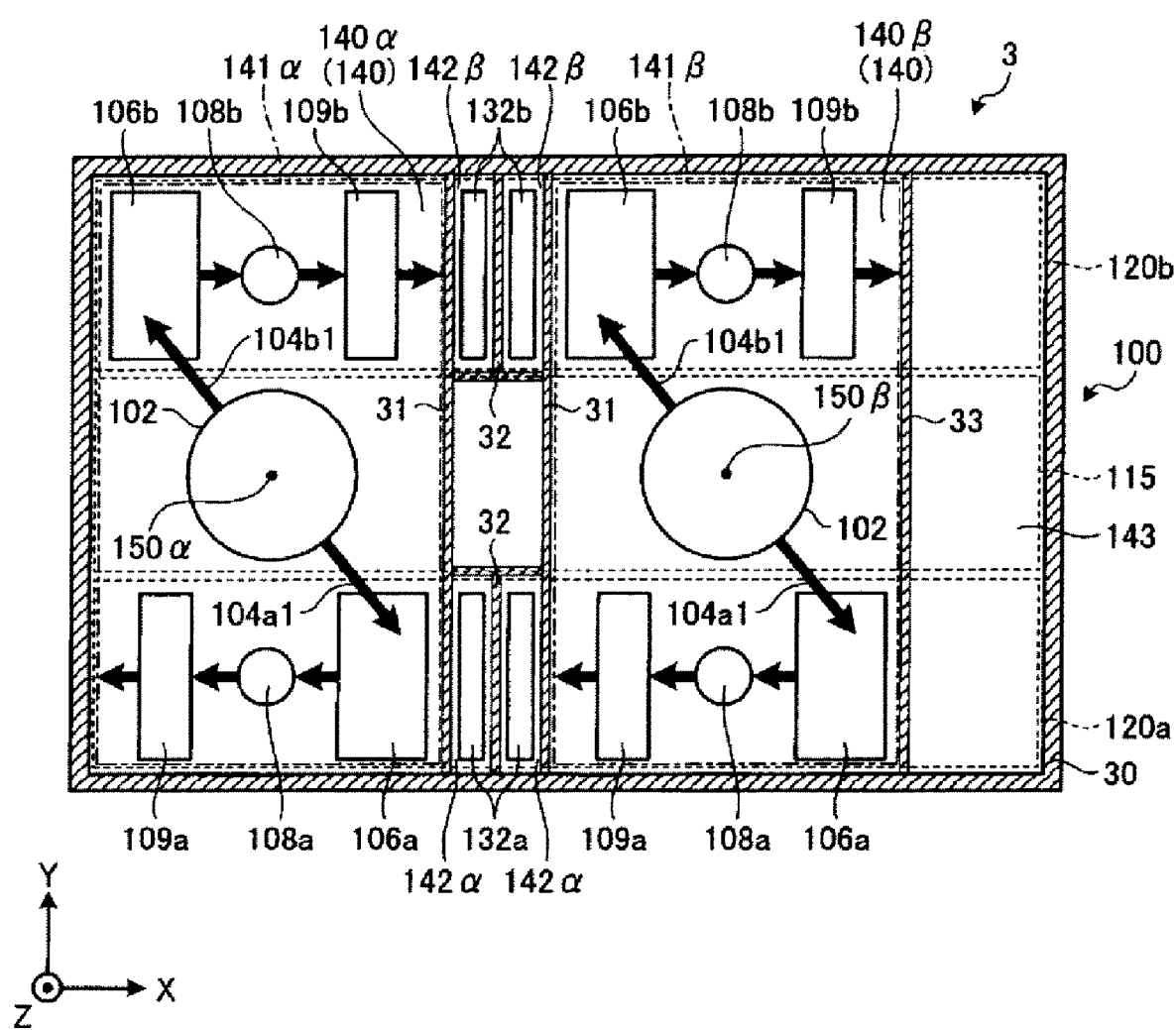
FIG. 7 is a diagram for describing a substrate liquid processing apparatus according to a modification example of the first exemplary embodiment.

Now, a modification example (hereinafter, referred to as "first modification example") of the first exemplary embodiment will be explained. FIG. 7 is a diagram for describing the substrate liquid processing apparatus 100 according to the first modification example.

As depicted in FIG. 7, in the first modification example, the first liquid line 104a1 and the first pump (the example of "first liquid sending mechanism") 106a are arranged to be point symmetrical with the second liquid line 104b1 and the second pump (the example of "second liquid sending mechanism") 106b when viewed from the top.

The device group 141α disposed at the left side of FIG. 7 will be explained in detail as an example. In the space 120a under the first processing section 20a, the first liquid line 104a1, the first pump 106a, the filter 108a and the heater 109a are connected to the tank 102 in sequence from the upstream side thereof. Further, in the space 120b under the second processing section 20b, the second pump 106b, the filter 108b and the heater 109b are connected to the tank 102.

In this first modification example, the first liquid line 104a1 and the first pump 106a are arranged to be point symmetrical with the second liquid line 104b1 and the second pump 106b with respect to a point 150a located in the space 115 under the transfer section 15.

Further, the device group 141β disposed on the right side of FIG. 7 also has the same layout as that of the above-stated device group 141α. That is, the first liquid line 104a1 and the first pump 106a are arranged to be point symmetrical with the second liquid line 104b1 and the second pump 106b with respect to a point 150β located in the space 115.

Furthermore, in the example shown in FIG. 7, though the points 150α and 150β are coincident with central points of the tanks 102 in the spaces 115, the locations of the points 150α and 150β are not limited thereto.

With this configuration, components can be shared in the substrate liquid processing apparatus 100. By way of example, positions (directions) of inlet openings of the first pump 106a and the second pump 106b with respect to the tank 102 can be set to be same. Furthermore, the first liquid line 104a1 and the second liquid line 104b1 may be set to have the same length.

Moreover, between a component to which the first liquid line 104a1, the first pump 106a, the filter 108a and the heater 109a are fixed and a component to which the second liquid line 104b1, the second pump 106b, the filter 108b and the heater 109b are fixed, the component having same specification can be used. Therefore, the components can be shared in the substrate liquid processing apparatus 100, which may lead to a cost cut.

Further, in case that a required specification is changed for the first pump 106a and the second pump 106b, for example, a design change is applied to each of the pump 106a and 106b. Even in such a case, by using the above-described layout, it is possible to apply the design change conducted in one of the pumps to the other. Accordingly, in case that the specification is changed in the substrate liquid processing apparatus 100, the design change can be conducted quickly, which enables a prompt response.

If the first liquid line 104a1 and the second liquid line 104b1 and so forth are arranged to be point symmetrical as stated above, in the device group 141α, for example, an outlet of the heater 109a is located near an end portion of the accommodation unit 30, whereas an outlet of the heater 109b is located near a central portion of the accommodation unit 30. For this reason, a length of the liquid line from the heater 109a to the processing units 16Ua and 16La may be different from a length of the liquid line from the heater 109b to the processing units 16Ub and 16Lb. This case will be explained in detail with reference to FIG. 8.

Figure 8:
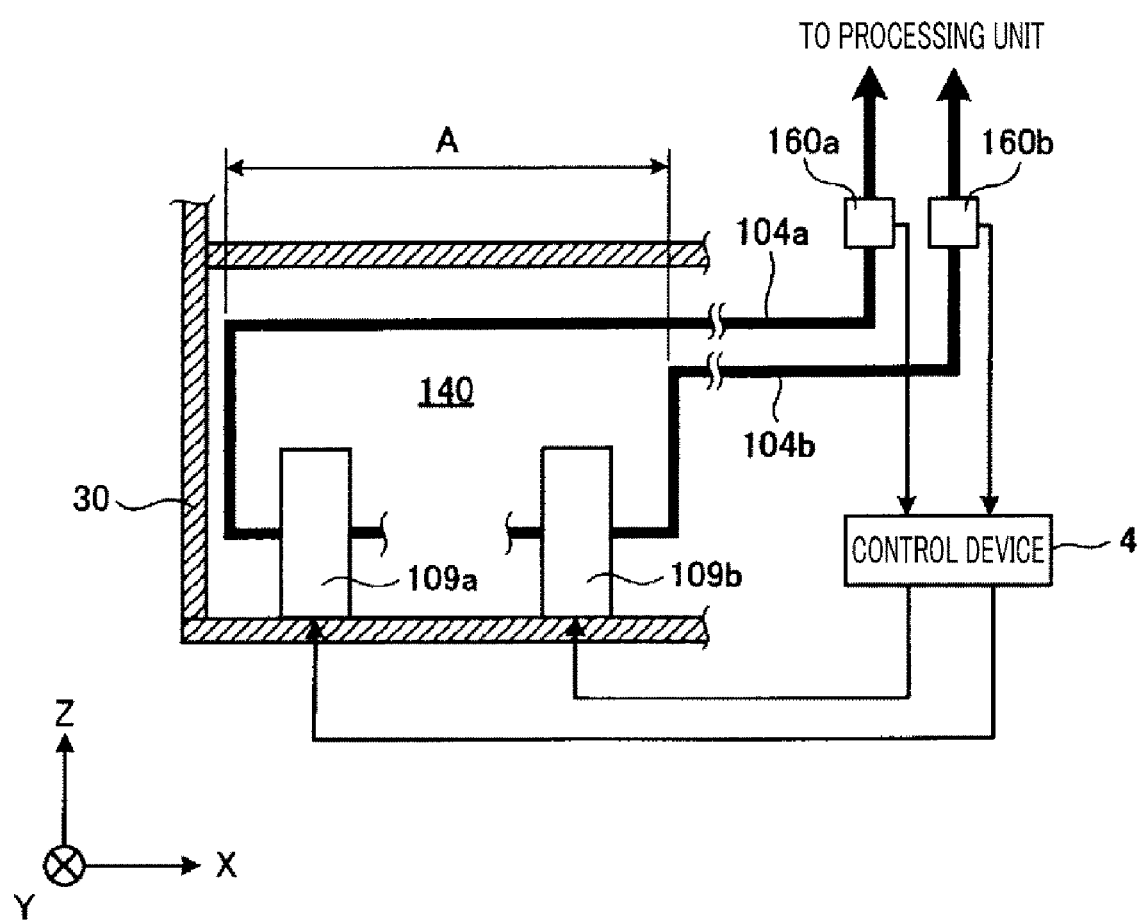
FIG. 8 is a side view schematically illustrating a liquid pipeline from a heater to a processing unit.

FIG. 8 is a side view schematically illustrating the liquid lines from the heaters 109a and 109b to the processing units 16Ua, 16La, 16Ub and 16Lb. As depicted in FIG. 8, the length of the liquid line of the circulation line 104a from the heater 109a to the processing units 16Ua and 16La may be longer than the length of the liquid line of the circulation line 104b from the heater 109b to the processing units 16Ub and 16Lb by a preset length A.

As a result, if preset temperatures of the processing liquids heated by the heaters 109a and 109b individually are set to be of the same value, the temperature of the processing liquid at a time when the processing liquid reaches the processing units 16Ua, 16La, 16Ub and 16Lb may be different between the circulation line 104a and the circulation line 104b. To elaborate, the temperature of the processing liquid of the circulation line 104a having the longer liquid line may become lower than the temperature of the processing liquid of the circulation line 104b.

In view of this problem, according to the first modification example, temperature detecting units 160a and 160b each configured to detect the temperature of the processing liquid are provided at positions of the circulation lines 104a and 104b where the length of the liquid line to the processing units 16Ua and 16La and the length of the liquid line to the processing units 16Ub and 16Lb are same or substantially same.

Each of the temperature detecting units 160a and 160b is configured to output a signal indicating the detected temperature of the processing liquid to the control device 4. The control device 4 controls the heaters 109a and 109b based on the detected temperatures of the processing liquid. To be specific, the control device 4 controls the heaters 109a and 109b such that the temperature of the processing liquid detected by the temperature detecting unit 160a and the temperature of the processing liquid detected by the temperature detecting unit 160b are same.

Thus, in the substrate liquid processing apparatus 100 according to the first modification example, at the time when the processing liquid reaches the processing units 16Ua, 16La, 16Ub and 16Lb, the temperature of the processing liquid of the circulation line 104a and the temperature of the processing liquid of the circulation line 104b become same, so that the uniform processing can be performed.

Second Exemplary Embodiment

Now, a substrate liquid processing apparatus 100 according to a second exemplary embodiment will be explained. In the above-described first exemplary embodiment, the first pump 106a and the second pump 106b are connected to the single tank 102. In the second exemplary embodiment, however, only a single pump is individually connected to a single tank.

Figure 9:
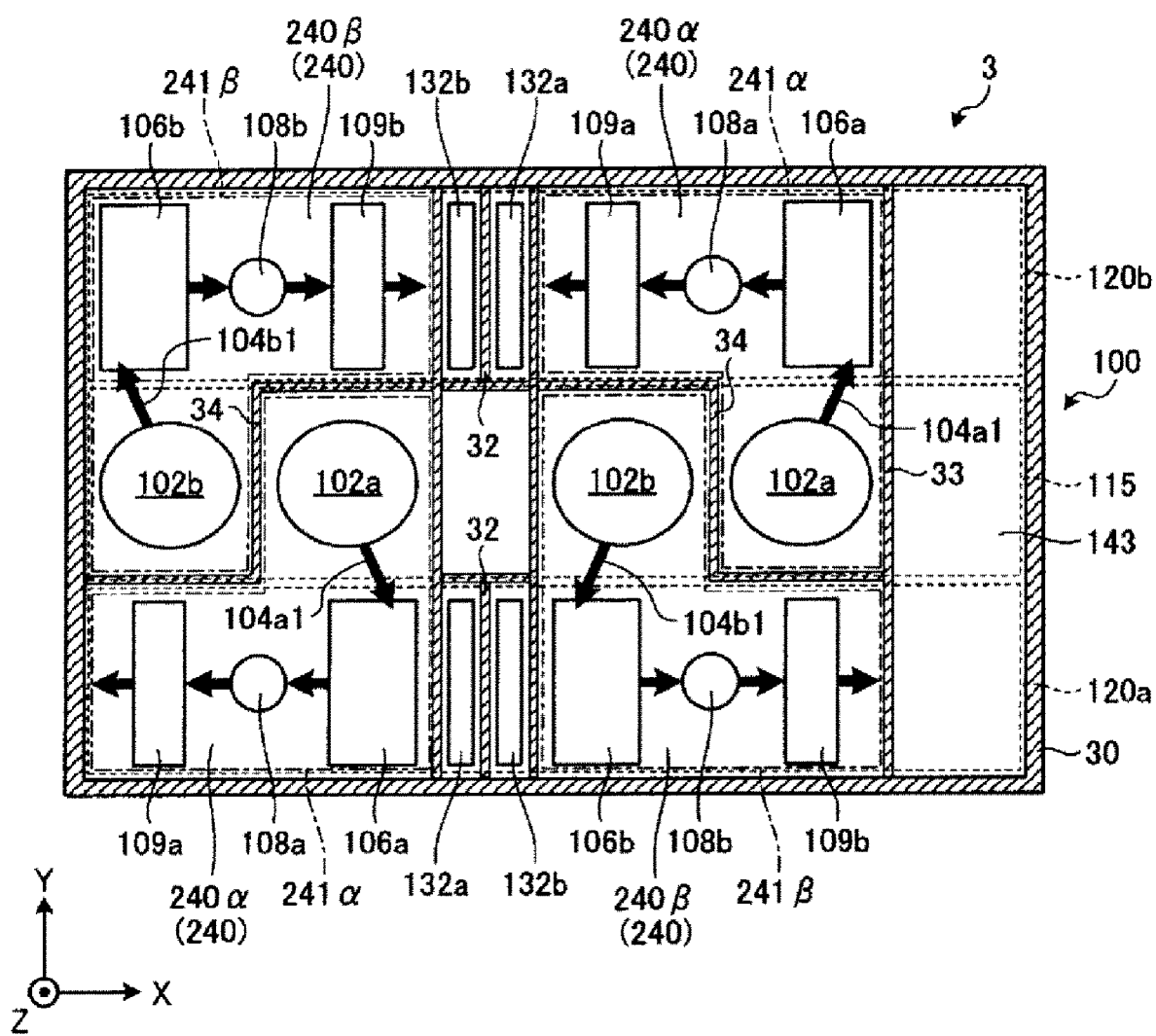
FIG. 9 is a diagram for describing a substrate liquid processing apparatus according to a second exemplary embodiment.

FIG. 9 is a diagram for describing the substrate liquid processing apparatus 100 according to the second exemplary embodiment and depicts a transversal cross sectional view of a processing station 3 taken along an X-Y plane. In the following description, parts identical to those described in the first exemplary embodiment will be assigned same reference numerals, and redundant description will be omitted.

As shown in FIG. 9, the substrate liquid processing apparatus 100 according to the second exemplary embodiment includes a first tank 102a and a second tank 102b. Further, the first tank 102a is an example of a first reservoir, and the second tank 102b is an example of a second reservoir.

Both the first tank 102a and the second tank 102b are placed directly under a transfer section 15, that is, in the space 115. The first tank 102a is connected with a first pump 106a, and the second tank 102b is connected with a second pump 106b.

Further, in case that the first pump 106a is disposed directly under either of the first processing section 20a and the second processing section 20b, the second pump 106b is disposed directly under the other of the first processing section 20a and the second processing section 20b.

To elaborate, in case that the first pump 106a is disposed directly under the first processing section 20a (in the space 120a), it is desirable that the second pump 106b is located directly under the second processing section 20b (in the space 120b). Furthermore, in case that the first pump 106a is placed directly under the second processing section 20b (in the space 120b), it is desirable that the second pump 106b is disposed directly under the first processing section 20a (in the space 120a).

As stated, as the first tank 102a and the second tank 102b are disposed between the first pump 106a and the second pump 106b, that is, as the first tank 102a and the second tank 102b are disposed directly under the transfer section 15, the space-saving of the substrate liquid processing apparatus 100 can be achieved.

Further, a processing liquid stored in the first tank 102a and a processing liquid stored in the second tank 102b may be of a same kind or different kinds.

Here, if the processing liquids stored in the first tank 102a and the second tank 102b are different, the single first pump 106a and the single second pump 106b are individually disposed directly under each of the first processing section 20a (in the space 120a) and the second processing section 20b (in the space 120b), as shown in FIG. 9.

Accordingly, the different kinds of processing liquids can be supplied to the processing units 16Ua and 16La of the first processing section 20a and the processing units 16Ub and 16Lb of the second processing section 20b from the first pump 106a and the second pump 106b disposed in the vicinity of the corresponding processing sections, respectively.

To elaborate, the processing liquids are respectively supplied to the processing units 16Ua and 16La of the first processing section 20a from the first tank 102a at a left side of FIG. 9 via the first pump 106a and from the second tank 102b at a right side of FIG. 9 via the second pump 106b. Further, the processing liquids are respectively supplied to the processing units 16Ub and 16Lb of the second processing section 20b from the first tank 102a at a right side of FIG. 9 via the first pump 106a and from the second tank 102b at a left side of FIG. 9 via the second pump 106b.

Further, with regard to the liquid lines 104a1 and 104b1 from the tanks 102a and 102b to the pumps 106a and 106b, respectively, it is desirable that the lengths of the liquid lines 104a1 respectively corresponding to the pumps 106a at the left side and the right side of FIG. 9 are same and the lengths of the liquid lines 104b1 respectively corresponding to the pumps 106b at the left side and the right side of FIG. 9 are same. With this configuration, in the substrate liquid processing apparatus 100, it is possible to perform the uniform processing in the processing units 16Ua, 16La, 16Ub and 16Lb, respectively.

Further, the control valves 132a and 132b are disposed in the vicinity of the corresponding first pump 106a and the second pump 106b.

In the example of the substrate liquid processing apparatus 100 shown in FIG. 9, a first device group including the first tank 102a and the first pump 106a corresponding to the first tank 102a is assigned by a reference numeral 241α. Likewise, in FIG. 9, a second device group including the second tank 102b and the second pump 106b corresponding to the second tank 102b is indicated by a reference numeral 241β.

In the accommodation unit 30, a partition wall 34 is provided between the first device group 241α and the second device group 241β. Accordingly, a space 240 within the accommodation unit 30 is divided into a space 240α and a space 240β by the partition wall 34. For example, each of the space 240α and the space 240β is formed to have a substantially L-shape when viewed from the top.

Furthermore, in the accommodation unit 30, the first tank 102a of the first device group 241α is accommodated in the substantially L-shaped space 240α when viewed from the top and within the space 115 directly under the transfer section 15. Further, in the accommodation unit 30, the second tank 102b of the second device group 241β is disposed in the substantially L-shaped space 240β when viewed from the top and within the space 115.

As stated above, in the substrate liquid processing apparatus 100, the first device group 241α and the second device group 241β are accommodated in the accommodation unit 30 while being separated from each other. Accordingly, in the substrate liquid processing apparatus 100, it is possible to perform independent control of air conditioning such as gas exhaust or temperature control for each of the space 240α in which the first device group 241α is placed and the space 240β in which the second device group 241β is placed, so that quality of substrate processing can be improved.

As discussed above, according to the second exemplary embodiment, since the first tank 102a and the second tank 102b are both located directly under the transfer section 15, it is possible to achieve the space-saving in the substrate liquid processing apparatus 100. Since the others effects are the same as those described in the first exemplary embodiment, redundant description thereof will be omitted here.

Modification Example of Second Exemplary Embodiment

Figure 10:
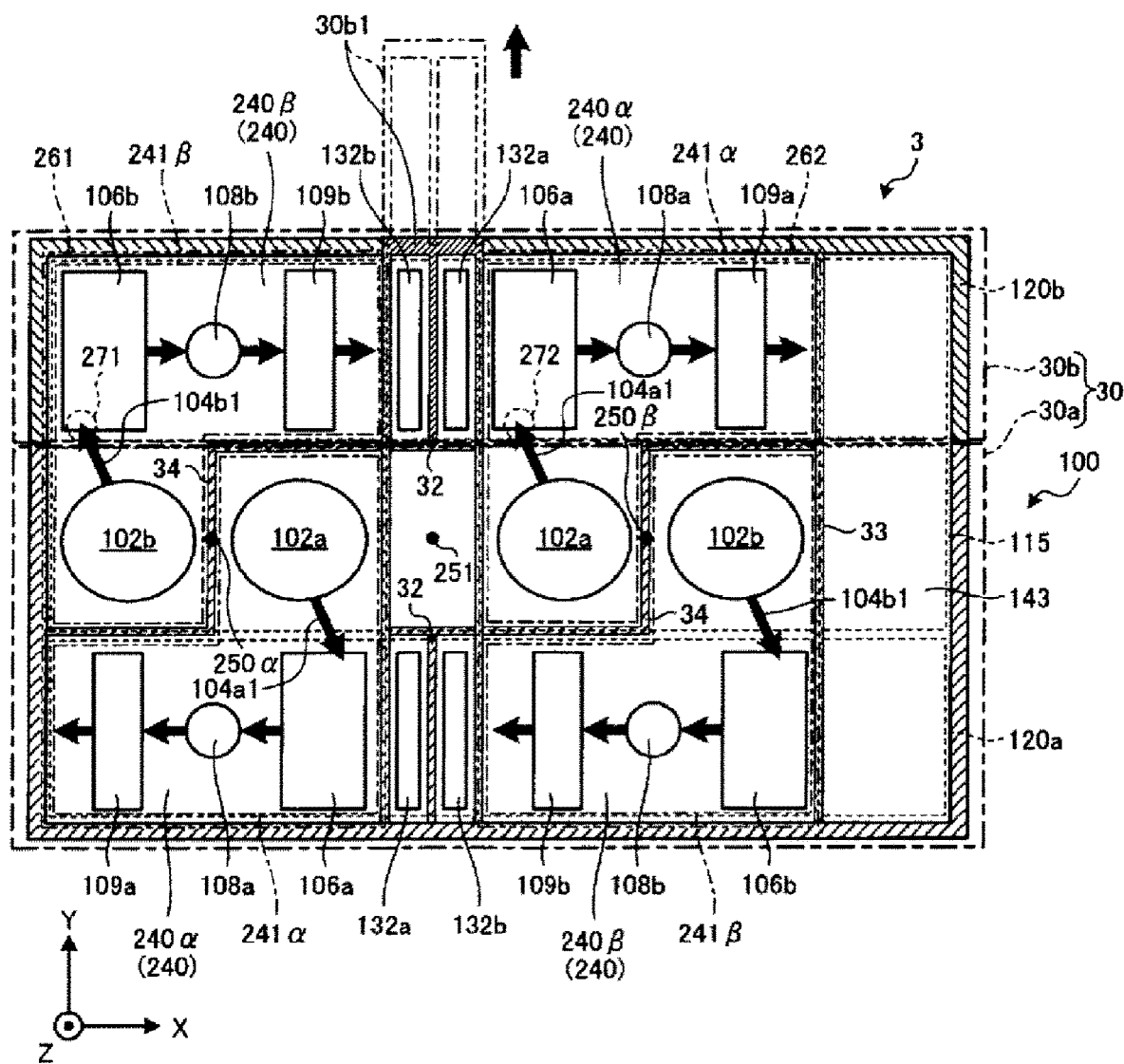
FIG. 10 is a diagram for describing a substrate liquid processing apparatus according to a modification example of the second exemplary embodiment.

Now, a modification example (hereinafter, referred to as "second modification example") of the second exemplary embodiment will be explained. FIG. 10 is a diagram for describing the substrate liquid processing apparatus 100 according to the second modification example.

As depicted in FIG. 10, in the second modification example, the first liquid line 104a1 and the first pump 106a are arranged to be point symmetrical with the second liquid line 104b1 and the second pump 106b with respect to a point 250α (250β) located in the space 115 under the transfer section 15 when viewed from the top, as in the first modification example.

Further, in the second modification example, if combinations of the corresponding first and second device groups 241α and 241β are referred to as groups 261 and 262, the groups 261 and 262 are arranged to be point symmetrical when viewed from the top.

Further, in the following description, the group 261 having the first device group 241α and the second device group 241β arranged at the left side of FIG. 10 may sometimes be referred to as "first group 261," and the group 262 having the first device group 241α and the second device group 241β arranged at the right side of FIG. 10 may sometimes be referred to as "second group 262" for the convenience of explanation. Further, here, it is assumed that the first device group 241α includes the first tank 102a, the first liquid line 104a1, the first pump 106a, the filter 108a and the heater 109a. Likewise, it is assumed that the second device group 241β includes the second tank 102b, the second liquid line 104b1, the second pump 106b, the filter 108b and the heater 109b.

The substrate liquid processing apparatus 100 according to the second modification example will be described in detail. The first device group 241α and the second device group 241β constituting the first group 261 and the first device group 241α and the second device group 241β constituting the second group 262 are arranged to be point symmetric with respect to a point 251 located in the space 115 under the transfer section 15 when viewed from the top.

Further, in the example depicted in FIG. 10, though the point 251 is shown to be located between the adjacent tanks 102, this location is just an example and is not anyway limiting. Further, though each of the points 250α and 250β is shown to be located between the corresponding tanks 102a and 102b in the space 115, these locations are also examples and are not limiting. Moreover, in FIG. 10, though the two groups 261 and 262 are illustrated, the number of the groups may be three or more.

As stated, in the second modification example, there are provided the plural groups 261 and 262 each of which includes the first device group 241α and the second device group 242β, and these plural groups are 261 and 262 are arranged to be point symmetrical when viewed from the top.

With this configuration, in the substrate liquid processing apparatus 100 according to the second modification example, components can be shared. That is, by way of example, positions (directions) of inlet openings of the first pump 106a and the second pump 106b with respect to the tanks 102a and 102b can be set to be identical in the first and second groups 261 and 262. Furthermore, the first liquid line 104a1 and the second liquid line 104b1 may be set to have the same length.

From this point of view, same specifications of components or liquid lines can be used for the first group 261 and the second group 262. Therefore, the components can be shared in the substrate liquid processing apparatus 100, which may lead to the cost cut. Since other effects are the same as those described in the first modification example, redundant description thereof will be omitted here.

A size of the substrate liquid processing apparatus 100 may be enlarged due to a size of the wafer W (see FIG. 1), the content of processing upon the wafer W, and so forth. For the large-sized substrate liquid processing apparatus 100, it may be desirable that the substrate liquid processing apparatus 100 is allowed to be divided to improve "transportability" or "installation convenience" when the apparatus is transferred to and installed in a manufacturing factory of the wafer W by a worker.

By way of example, in the example shown in FIG. 10, the accommodation unit 30 is configured to be divided into a first accommodation unit 30a and a second accommodation unit 30b. Further, in FIG. 10, to clarify illustration of a layout of the first accommodation unit 30a and the second accommodation unit 30b, the first accommodation unit 30a is indicated by dashed dotted line, and the second accommodation unit 30b is indicated by a dashed double-dotted line.

In the first accommodation unit 30a, the first processing section 20a (see FIG. 4), the transfer section 15 (see FIG. 4), the first and second pumps 106a and 106b disposed directly under the first processing section 20a, the first and second tanks 102a and 102b disposed directly under the transfer section 15, and so forth are accommodated. Further, in the second accommodation unit 30b, the second processing section 20b (see FIG. 4), the first and second pumps 106a and 106b disposed directly under the second processing section 20b, and so forth are accommodated.

Furthermore, devices to be accommodated in each of the divided accommodation units 30a and 30b are previously installed therein, and the liquid lines which is cross a boundary between the first accommodation unit 30a and the second accommodation unit 30b are left unconnected thereto.

In addition, in FIG. 10, portions of the liquid lines crossing the boundary between the first accommodation unit 30a and the second accommodation unit 30b are indicated by dashed-lined closed curves 271 and 272, and will be referred to as "joint portions 271 and 272".

For example, the first accommodation unit 30a and the second accommodation unit 30b are connected after carried into the manufacturing factory in a divided state. As the transfer section 15 and the second processing section 20b are connected and the liquid lines at the joint portions 271 and 272 are connected, the installation of the substrate liquid processing apparatus 100 is completed.

As stated above, the first and second processing sections 20a and 20b and the transfer section 15 are accommodated in the accommodation unit 30 which can be divided into the unit (first accommodation unit 30a) where the first processing section 20a and the transfer section 15 are accommodated and the unit (second accommodation unit 30b) where the second processing section 20b is accommodated.

Accordingly, since the transfer section 15 and the first processing section 20a are transferred as a single body while being accommodated in the first accommodation unit 30a, the worker needs to adjust the position of the transfer section 15 with respect to only the second processing section 20b when installing the substrate liquid processing apparatus 100 in the manufacturing factory. Therefore, the time required for the adjustment in the substrate liquid processing apparatus 100 can be shortened.

The configuration of the accommodation unit 30 is not limited to the above example. By way of another example, the accommodation unit 30 may be divided such that the first processing section 20a is accommodated in the first accommodation unit 30a while the transfer section 15 and the second processing section 20b are accommodated in the second accommodation unit 30b.

Furthermore, in the second modification example, the first and second liquid lines 104a1 and 104b1 of the first group 261 are arranged to be point symmetrical with the first and second liquid lines 104a1 and 104b1 of the second group 262. For this reason, as depicted in FIG. 10, a part of the joint portions 271 and 272 (here, the joint portion 272) may be positioned near the central portion of the substrate liquid processing apparatus 100.

Thus, in the second modification example, a portion of the accommodation unit 30 near the joint portion 272 is configured to be additionally divided. With this configuration, the substrate liquid processing apparatus 100 can be easily installed.

To elaborate, the second accommodation unit 30b includes a slide accommodation unit 30b1. The slide accommodation unit 30b1 is disposed at a place near the joint portion 272 which is difficult for the worker to access within the second accommodation unit 30b, for example, is disposed between the first group 261 and the second group 262.

The slide accommodation unit 30b1 is taken out of the second accommodation unit 30b by being slid out in the positive Y-axis direction. Further, the slide accommodation unit 30b1 taken out is indicated by an imaginary line (dashed double-dotted line) in FIG. 10. To slide the slide accommodation unit 30b1 easily, a rotational body such as a roller or the like can be inserted between the slide accommodation unit 30b1 and the second accommodation unit 30b or the bottom surface.

As described above, as the slide accommodation unit 30b1 is taken out, a workspace for connecting the liquid lines is provided in the vicinity of the joint portion 272. Therefore, the worker can access the joint portion 272 easily, and connect the liquid lines, that is, it is possible to install the substrate liquid processing apparatus 100 easily.

Furthermore, in the above-described example, though the slide accommodation unit 30b1 is configured to be separated from the second accommodation unit 30b by being slid in the Y-axis direction, the exemplary embodiment is not limited thereto, and the slide accommodation unit 30b1 may be divided by being slid in, for example, the Z-axis direction or in any other way.

In addition, in the above-described example, the slide accommodation unit 30b1 is included in the second accommodation unit 30b. However, the slide accommodation unit 30b1 may belong to the first accommodation unit 30a. Furthermore, the above-described configuration, in which the accommodation unit 30 is divided into the first and second accommodation units 30a and 30b and the slide accommodation unit 30b1, may also applicable to the first and second exemplary embodiments and the first modification example.

Third Exemplary Embodiment

Figure 11:
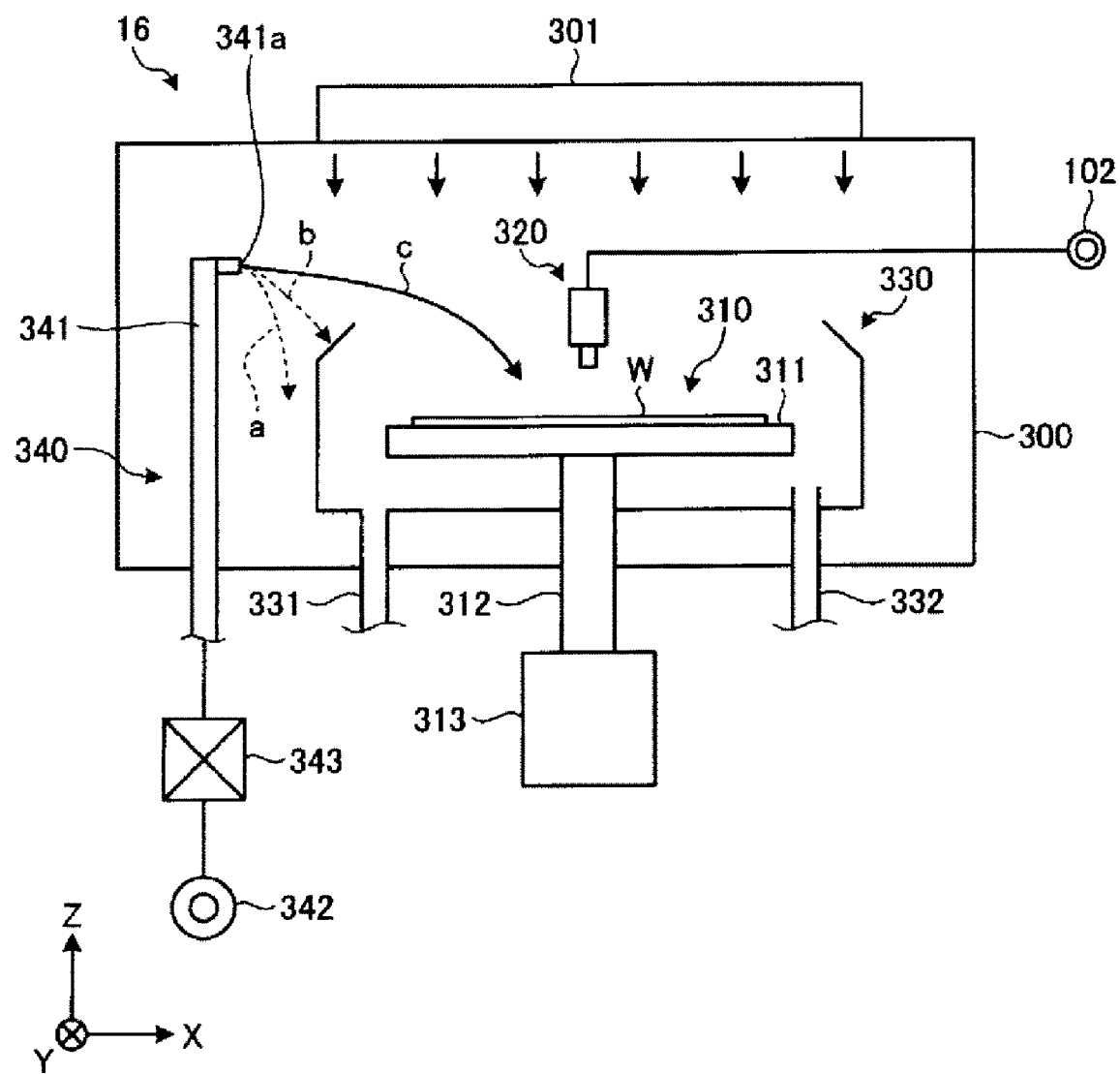
FIG. 11 is a diagram illustrating a schematic configuration of a processing unit according to a third exemplary embodiment.

Now, a substrate liquid processing apparatus 100 according to a third exemplary embodiment will be explained. First, a schematic configuration of the processing unit 16 will be explained with reference to FIG. 11. FIG. 11 is a diagram illustrating the schematic configuration of the processing unit 16.

As depicted in FIG. 11, the processing unit 16 includes a chamber 300, a substrate holding mechanism 310, a first processing liquid supply unit 320, a recovery cup 330 and a second processing liquid supply unit 340.

The chamber 300 accommodates the substrate holding mechanism 310, the first processing liquid supply unit 320, the recovery cup 330 and the second processing liquid supply unit 340. A fan filter unit (FFU) 301 is provided on the ceiling of the chamber 300. The FFU 301 forms a downflow in the chamber 300.

The substrate holding mechanism 310 is provided with a holding unit 311, a support unit 312, and a driving unit 313. The holding unit 311 holds the wafer W horizontally. The support unit 312 is a vertically extending member, and has a base end portion supported rotatably by the driving unit 313 and a tip end portion supporting the holding unit 311 horizontally. The driving unit 313 rotates the support unit 312 around a vertical axis. The substrate holding mechanism 310 rotates the support unit 312 by using the driving unit 313, so that the holding unit 311 supported by the support unit 312 is rotated, and, hence, the wafer W held by the holding unit 311 is rotated.

The first processing liquid supply unit 320 supplies a processing liquid onto the wafer W. The first processing liquid supply unit 320 is connected to a processing liquid supply source such as the aforementioned tank 102.

The recovery cup 330 is disposed to surround the holding unit 311, and collects the processing liquid scattered from the wafer W by the rotation of the holding unit 311. A drain port 331 is formed on the bottom of the recovery cup 330, and the processing liquid collected by the recovery cup 330 is discharged from the drain port 331 to the outside of the processing unit 16. Further, an exhaust port 332 is formed on the bottom of the recovery cup 330 to discharge a gas supplied from the FFU 301 to the outside of the processing unit 16.

The second processing liquid supply unit 340 supplies a second processing liquid onto the wafer W. The second processing liquid may be, by way of example, DIW (pure water). Though the following description will be provided for the case where the second processing liquid is the DIW, the second processing liquid is not limited thereto and may be implemented by various other kinds of processing liquids.

The second processing liquid supply unit 340 is equipped with a discharge unit 341 provided at an appropriate position in the vicinity of the recovery cup 330. One end of the discharge unit 341 is connected to a DIW supply source 342, and a discharge port 341a is provided at the other end of the discharge unit 341. The discharge port 341a is disposed at a position oriented toward the wafer W from a top opening of the recovery cup 330 to discharge the DIW supplied from the DIW supply source 342.

A substrate processing is performed on the wafer W by the processing liquid supplied from the first processing liquid supply unit 320. Depending on the kind of the substrate processing, however, plural kinds of processing liquids may be used. In such a case, when switching from a processing liquid currently being supplied to the wafer W to a processing liquid to be used in a next processing, for example, no processing liquid is supplied to the wafer W for a time period required for the switchover of the processing liquids.

In view of this, in the processing unit 16, the DIW is supplied to the wafer W from the second processing liquid supply unit 340 at the time when the processing liquids are switched, so that it is possible to suppress the liquid supply on the wafer W from being stopped, and also suppress the wafer W from being dried.

In the conventional processing unit, since a discharge amount of the DIW from the second processing liquid supply unit is set to be increased gradually when starting the supply of the DIW to the wafer W, a trajectory of the DIW is in the order of an arrow "a," an arrow "b," and an arrow "c" shown in FIG. 11. Thus, when the DIW is in the state indicated by the arrow "b," the DIW may spatter on an outer peripheral surface of the recovery cup 330, which is not desirable.

Thus, in the third exemplary embodiment, a suction unit 343 is provided between the DIW supply source 342 and the discharge port 341a. The suction unit 343 may be implemented by, by way of example, but not limitation, a suckback valve.

With the above-described configuration, at the time when supplying the DIW to the wafer W, the DIW may be returned back by the suction unit 343 and may be then discharged. Accordingly, a flow velocity (per second) of the DIW in the discharge port 341a can be increased. Thus, immediately after discharged, the DIW is turned into the state of the arrow "c," so that the DIW can be suppressed from unnecessarily spattering onto the outer peripheral surface of the recovery cup 330 or the like.

Fourth Exemplary Embodiment

Now, a substrate liquid processing apparatus 100 according to a fourth exemplary embodiment will be explained.

Figure 12:
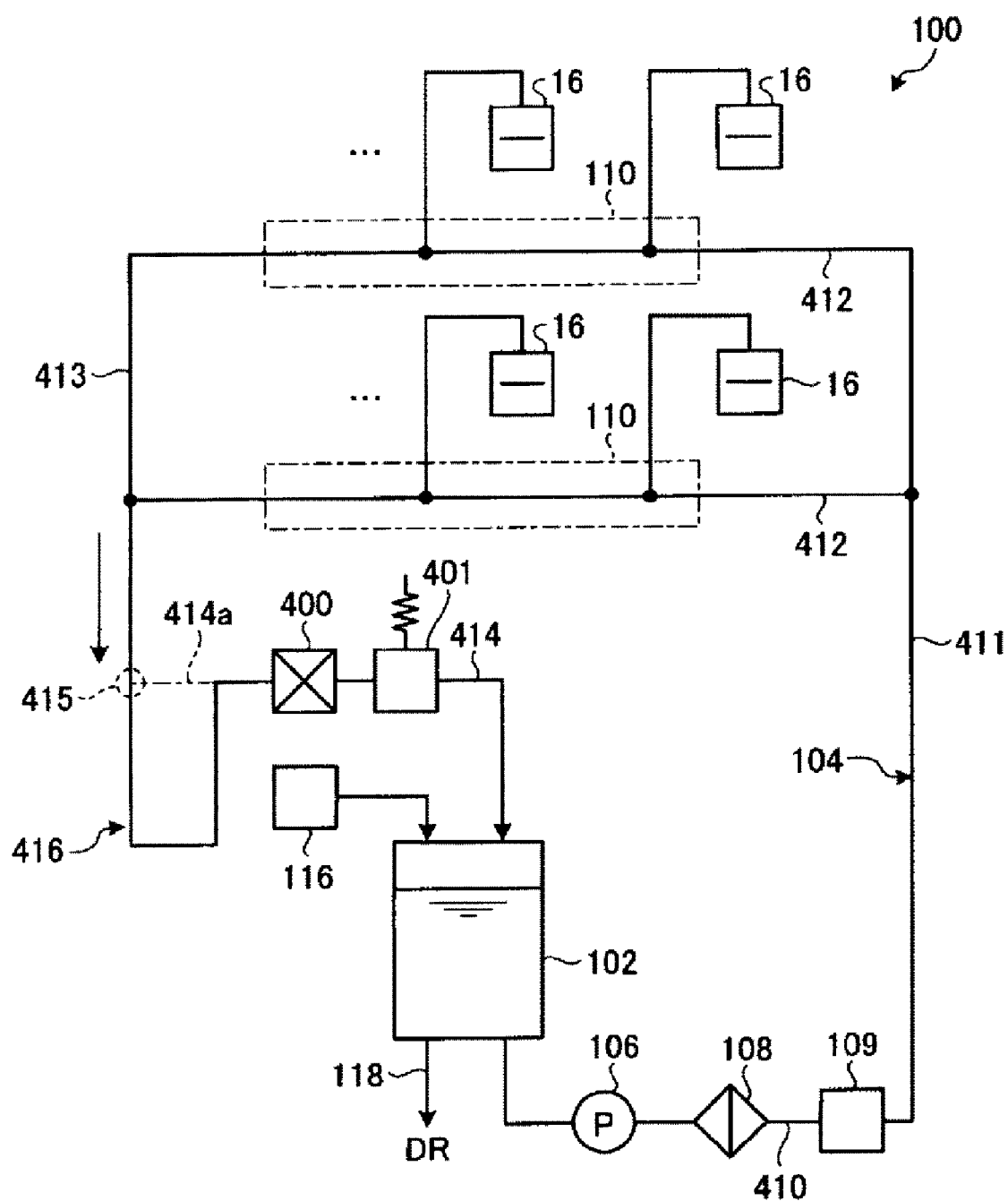
FIG. 12 is a diagram illustrating a schematic configuration of a processing liquid supply system according to a fourth exemplary embodiment.

FIG. 12 is a diagram illustrating a schematic configuration of a processing liquid supply system.

As depicted in FIG. 12, the substrate liquid processing apparatus 100 is equipped with a circulation line 104. Further, an opening/closing valve 400 and a back pressure valve 401 are provided at the circulation line 104 in addition to the pump 106, the filter 108 and the heater 109 as stated above.

To elaborate, the circulation line 104 includes a first horizontal portion 410 horizontally extended from the tank 102; an ascending portion 411 connected to the downstream side of the first horizontal portion 410 and extended upwards; and a second horizontal portion 412 connected to the downstream side of the ascending portion 411 and extended horizontally. The circulation line 104 further includes a descending portion 413 connected to the downstream side of the second horizontal portion 412 and extended downwards; and a third horizontal portion 414 connected to the downstream side of the descending portion 413 and extended horizontally. The downstream side of the third horizontal portion 414 is connected to the tank 102. Further, the opening/closing valve 400 and the back pressure valve 401 are provided at the third horizontal portion 414.

In the substrate liquid processing apparatus 100, the processing liquid flowing in the tank 102 and the circulation line 104 may be replaced. When replacing the processing liquid, the processing liquid within the tank 102 and the circulation line 104 is first drained through the drain unit 118. Then, a new processing liquid is supplied into the tank 102 and the circulation line 104 from the tank liquid supplementing unit 116.

If, however, the new processing liquid arrives at the descending portion 413 via the first horizontal portion 410, the ascending portion 411 and the second horizontal portion 412 of the circulation line 104, the processing liquid drops within the descending portion 413. In such a case, like a third horizontal portion 414a indicated by an imaginary line in FIG. 12, for example, if the downstream side of the descending portion 413 and the upstream side of the third horizontal portion 414a are directly connected, the processing liquid collides with the third horizontal portion 414a to become a droplet state at a joint portion 415 enclosed by a dashed-lined circle. If the processing liquid in this droplet state is supplied to, for example, the back pressure valve 401, a friction may be generated between the processing liquid and a valve body of the back pressure valve 401, so that static electricity may be generated, which is not desirable for the back pressure valve 401.

Thus, in the fourth exemplary embodiment, a liquid collecting portion 416 is provided between the downstream side of the descending portion 413 and the upstream side of the third horizontal portion 414. Accordingly, since the new processing liquid flows into the back pressure valve 401 after being once collected in the liquid collecting portion 416, there occurs no such case where the processing liquid in the droplet state is supplied to the back pressure valve 401, so that the generation of static electricity in the back pressure valve 401 can be suppressed.

Furthermore, though the liquid collecting portion 416 is provided at the circulation line 104 in the above description, the exemplary embodiment is not limited thereto. By way of example, the liquid collecting portion may be provided at an upstream side of a stop valve in a new liquid supply line for supplying the new processing liquid to the circulation line 104. With this configuration, the new liquid which is not in the droplet state, is supplied to the stop valve from the liquid collecting portion, so that the flow rate in the stop valve can be appropriately adjusted.

Moreover, in the above-described first exemplary embodiment, the two tanks 106a and 106b are connected to the single tank 102, and in the second exemplary embodiment, the single pump 106a is connected to the single tank 102a. However, these may be appropriately combined.

Further, in the above-description, there is provided only one substrate transfer device 17 which is disposed in the transfer section 15. However, the exemplary embodiments are not limited thereto, and two or more substrate transfer devices may be provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the illustrative embodiments. It shall be understood that all modifications and embodiments conceived from the meaning and scope of the claims and their equivalents are included in the scope of the inventive concept.

We claim:

1. A substrate liquid processing apparatus, comprising:
   a transfer section in which a transfer device configured to transfer a substrate is provided;
   a processing section which is provided adjacent to the transfer section in a horizontal direction, and in which a liquid processing unit configured to process the substrate by using a processing liquid is provided;
   a tank configured to store the processing liquid therein; and
   a liquid sending mechanism provided at a liquid line connecting the tank and the liquid processing unit, and configured to send out the processing liquid stored in the tank into the liquid processing unit,
   wherein the tank is disposed directly under the transfer section,
   the liquid sending mechanism is disposed directly under the processing section.

2. The substrate liquid processing apparatus of claim 1, wherein multiple sets of device groups, each of which includes the tank and the liquid sending mechanism corresponding to the tank, are provided and the multiple sets of device groups are accommodated in an accommodation unit while being separated from each other.

3. The substrate liquid processing apparatus of claim 1, wherein the processing section includes a first processing section and a second processing section into which the substrate is transferred by the transfer device, and
   the liquid sending mechanism comprises:
   a first liquid sending mechanism disposed directly under the first processing section and connected to the tank; and
   a second liquid sending mechanism disposed directly under the second processing section and connected to the tank.

4. The substrate liquid processing apparatus of claim 3, wherein the first processing section and the second processing section are arranged at facing positions with the transfer section therebetween.

5. The substrate liquid processing apparatus of claim 3, further comprising:
a first liquid line connecting the tank and the first liquid sending mechanism; and
a second liquid line connecting the tank and the second liquid sending mechanism,
wherein a length of the first liquid line is equal to a length of the second liquid line.

6. The substrate liquid processing apparatus of claim 3, further comprising:
a first liquid line connecting the tank and the first liquid sending mechanism; and
a second liquid line connecting the tank and the second liquid sending mechanism,
wherein the first liquid line and the first liquid sending mechanism are arranged to be point symmetrical with the second liquid line and the second liquid sending mechanism when viewed from a top.

7. The substrate liquid processing apparatus of claim 3, wherein each of the first liquid sending mechanism and the second liquid sending mechanism comprises a pump driven by air supplied through an air line from an air supply unit,
wherein a length of the air line connecting the air supply unit and the pump of the first liquid sending mechanism is equal to a length of the air line connecting the air supply unit and the pump of the second liquid sending mechanism.

8. The substrate liquid processing apparatus of claim 1, wherein the tank comprises a first tank and a second tank, the processing section comprises a first processing section and a second processing section provided at facing positions with the transfer section therebetween, and the liquid sending mechanism comprises:
a first liquid sending mechanism disposed directly under the first processing section and connected to the first tank, and
a second liquid sending mechanism disposed directly under the second processing section and connected to the second tank.

9. The substrate liquid processing apparatus of claim 8, further comprising:
a first liquid line connecting the first tank and the first liquid sending mechanism; and
a second liquid line connecting the second tank and the second liquid sending mechanism,
wherein multiple groups, each of which includes a first device group having the first liquid line and the first liquid sending mechanism and a second device group having the second liquid line and the second liquid sending mechanism, are provided, and the multiple groups are arranged to be point symmetrical when viewed from a top.

10. The substrate liquid processing apparatus of claim 1, wherein the processing section comprises a first processing section and a second processing section provided at facing positions with the transfer section therebetween, and
the first processing section, the second processing section and the transfer section are accommodated in an accommodation unit which is allowed to be divided into a unit where the first processing section and the transfer section are accommodated and a unit where the second processing section is accommodated.

* * * * *